United States Patent [19]

Shimizu et al.

[11] Patent Number: 5,474,953
[45] Date of Patent: Dec. 12, 1995

[54] METHOD OF FORMING AN ISOLATION REGION COMPRISING A TRENCH ISOLATION REGION AND A SELECTIVE OXIDATION FILM INVOLVED IN A SEMICONDUCTOR DEVICE

[75] Inventors: Junzoh Shimizu; Naoya Matsumoto, both of Tokyo, Japan

[73] Assignee: NEC Corporation, Tokyo, Japan

[21] Appl. No.: 337,511

[22] Filed: Nov. 8, 1994

Related U.S. Application Data

[63] Continuation of Ser. No. 982,612, Nov. 27, 1992, abandoned.

[30] Foreign Application Priority Data

Nov. 28, 1991 [JP] Japan ................................ 3-339720

[51] Int. Cl.⁶ ................................................ H01L 21/76
[52] U.S. Cl. ........................ 437/67; 437/69; 437/968; 437/63; 148/DIG. 50
[58] Field of Search .............................. 437/67, 63, 64, 437/69, 968; 148/DIG. 50

[56] References Cited

U.S. PATENT DOCUMENTS

| 4,853,344 | 8/1989 | Darmawan ................................ 437/67 |
| 4,876,214 | 10/1989 | Yamaguchi et al. ................... 437/67 |
| 4,994,406 | 2/1991 | Vasquez et al. ......................... 437/67 |
| 5,061,653 | 10/1991 | Teng ........................................ 437/67 |
| 5,112,772 | 5/1992 | Wilson et al. ............................ 437/67 |

FOREIGN PATENT DOCUMENTS

| 0402897 | 12/1990 | European Pat. Off. . |
| 0534746 | 3/1993 | European Pat. Off. . |
| 0134948 | 5/1989 | Japan ...................................... 437/67 |
| 0078247 | 3/1990 | Japan ...................................... 437/67 |

OTHER PUBLICATIONS

Y.-C. Simon Yu et al., "Planarized Deep-Trench Process for Self-Aligned Double Polysilicon Bipolar Device Isolation," *Journal of the Electrochemical Society*, 1046, 137, No. 6, Jun. 1990, Manchester, N.H., US, pp. 1942–1950.
"Formation of Thermal Isolation Cap Oxide," *IBM Technical Disclosure Bulletin*, vol. 33, No. 4, Sep. 1990, pp. 463–465.

*Primary Examiner*—Brian E. Hearn
*Assistant Examiner*—Trung Dang
*Attorney, Agent, or Firm*—Burns, Doane, Swecker & Mathis

[57] ABSTRACT

The present invention provides a novel method of forming an isolation region comprising a trench isolation region and a selective oxidation film region involved in a semiconductor integrated circuit device. A silicon oxide film is deposited on a surface of a trench groove formed within a semiconductor bulk, followed by a deposition of a polycrystalline silicon material. The silicon oxide film within the trench groove is subjected to etching up to a predetermined depth so as to form a hollow portion. A polycrystalline silicon film is deposited within the hollow portion and on both surfaces of the polycrystalline silicon material and the semiconductor bulk. The polycrystalline silicon film within the hollow portion, the polycrystalline silicon material and the semiconductor bulk in the vicinity of the trench groove is subjected to selective oxidation so as to form a selective oxidation film region. It is also permissive that a silicon nitride film is deposited on the silicon oxide film covering the surface of the trench groove prior to the deposition of the polycrystalline silicon material.

3 Claims, 8 Drawing Sheets

METHOD OF FORMING AN ISOLATION REGION COMPRISING A TRENCH ISOLATION REGION AND A SELECTIVE OXIDATION FILM INVOLVED IN A SEMICONDUCTOR DEVICE

This application is a continuation of application Ser. No. 07/982,612, filed Nov. 27, 1992, now abandoned.

BACKGROUND OF THE INVENTION

The invention relates to a method of forming an isolation region involved in a semiconductor device, and more particularly to a method of forming an isolation region comprising a combination of a trench isolation region with a selective oxidation isolation region, which is involved in a semiconductor device including bipolar transistor circuits.

In recent years, a semiconductor device including both emitter coupled logic circuits (ECL circuits) involving super high speed performance bipolar transistors and super high integrated complementary metal oxide semiconductor transistor circuits (CMOS circuits) with a low power consumption has been developed and known in the art. In such a semiconductor device, both the ECL circuits and the CMOS circuits, especially serving as memory device are formed on a single chip. With respect to isolation of such a semiconductor device, the isolation of the CMOS circuit region involved in the semiconductor device utilizes a selective oxidation such as a local oxidation of silicon (LOCOS). The isolation of the ECL circuit region involving such bipolar transistors utilizes a combination of the selective oxidation such as a local oxidation of silicon (LOCOS) with a trench isolation.

The conventional method of forming the isolation region comprising the combination of the selective oxidation isolation region with the trench isolation region, which is involved in the bipolar transistor ECL circuit region of the semiconductor device, will now be described with reference to FIGS. 1A to 1E.

With reference to FIG. 1A, the bipolar transistor circuit region of the semiconductor device has a p-type silicon substrate 1. An $n^+$-type silicon buried layer 2 is formed on the p-type silicon substrate 1. An $n^-$-type epitaxial layer 3 is so formed as to overly the $n^+$-type silicon buried layer 2. A silicon nitride film 4 having a predetermined thickness is so deposited as to cover an entire surface of the $n^-$-type epitaxial layer 3. The silicon nitride film 4 is subjected to patterning so as to form an opening having a predetermined size. An etching process is accomplished by using the patterned silicon nitride film 4 as a mask so that the $n^-$-type epitaxial layer 3 and the $n^+$-type silicon buried layer 2 are removed but only directly under the opening region of the silicon nitride film 4. Further, the p-type silicon substrate 1 is removed up to a predetermined depth but only directly under the opening region of the silicon nitride film 4. As a result of these steps, a trench groove having predetermined sizes in the length, the width and the depth is formed in the three layers comprising the p-type silicon substrate 1, the n -type silicon buried layer 2 and the $n^-$-type epitaxial layer 3. After that, a silicon oxide film 5 having a thickness in the range from 1500 to 2000 angstroms is so formed as to cover an entire surface of the inner walls of the trench groove.

With reference to FIG. 1B, a polycrystalline silicon material 6 is deposited on the silicon oxide film 5 covering the inner wall surface of the trench groove so that the trench groove is completely filled with the polycrystalline silicon material 6. Further, the polycrystalline silicon material 6 except within the trench groove is unnecessary and thus is so removed as to have the polycrystalline silicon material 6 remain within the trench groove only.

With reference to FIG. 1C, a removal of the silicon nitride film 4 which has been finished serving as the mask for the etching process follows the removal of the unnecessary portions of the polycrystalline silicon material 6. The result of the removal of both the silicon nitride film 4 and the unnecessary portions of the polycrystalline silicon material 6 is that an upper surface of the $n^-$-type epitaxial layer 3 is exposed. Subsequently, the $n^-$-type epitaxial layer 3 is oxidized but only a surface region thereof having a depth in the range from 300 to 500 angstroms thereby resulting in a formation of a silicon oxide film having a thickness in the range from 300 to 500 angstroms, while an illustration thereof is omitted. In addition to the above, a polycrystalline silicon film 7 is deposited up to a thickness in the range from 500 to 1000 angstroms so as to cover the exposed upper surfaces of the $n^-$-type epitaxial layer 3, of the silicon oxide film 5 and of the polycrystalline silicon material 6 within the trench groove. After that, a silicon nitride film 8 is deposited on the polycrystalline silicon film 7 up to a thickness in the range from 2000 to 3000 angstroms.

With reference to FIG. 1D, the silicon nitride film 8 is subjected to patterning so that a silicon nitride film 8 is removed but only a predetermined area thereof overlying the trench groove and its vicinity portions. The result of the patterning is that the silicon oxide film 8 is formed with an opening area, whose peripheral edge fences the trench groove and the $n^-$-type epitaxial layer 3 in the vicinity portions of trench groove.

With reference to FIG. 1E, a selective oxidization is implemented by using the patterned silicon nitride film 8 as a mask. The result of the selective oxidization is that the trench groove and its vicinity portions in the trench groove the $n^-$-type epitaxial layer 3 underlying the opening area of the silicon nitride film 8 are oxidized up to a depth in the range from 4000 to 8000 angstroms. Thus, a thick silicon oxide film 9 is formed in the surface area of the device except for the covered area by the patterned silicon nitride film 8 thereby completing a formation of the isolation region comprising the combination of the trench isolation region with the selective oxidation film.

By the way, it is no doubt apparent that such semiconductor integrated circuit devices such as the bipolar transistor ECL circuits are required to have a higher degree of its integration. The enlargement of a degree of the integration of the semiconductor integrated circuit device forces each element involved in the semiconductor integrated circuit device to be minimized, in addition distances between elements of the semiconductor integrated circuit device to be shorted. Needless to say, such minimization of each element involved in the semiconductor integrated circuit device forces minimizing the isolation region comprising the combination of the trench isolation and the selective oxidation isolation.

As the minimization of the isolation region of the device is improved, the above conventional method of forming the isolation region comprising the combination of the trench isolation region with the selective oxidation film is, however, engaged with following disadvantages. For example, when an edge portion of the selective oxide film, or the silicon oxide film 9 has a larger distance than approximately 1.5 micrometers in the horizontal direction from the trench isolation region, or the silicon oxide film 5, disadvantages with the isolation region involved in the semiconductor integrated circuit device is not considerable. In contrast to the above, when an edge portion of the selective oxide film, or the silicon oxide film 9 has a smaller distance than approximately 1.0 micrometers in the horizontal direction from the trench isolation region, or the silicon oxide film 5, disadvantages with the isolation region involved in the semiconductor integrated circuit device is considerable.

Disadvantages with the isolation region comprising the combination of the trench isolation region with the selective oxidation isolation region will subsequently be described with referring to FIG. 1E.

One of disadvantages with the isolation region is associated with crystal defects generated in the silicon oxide film 9 of the isolation region. When an edge portion of the selective oxide film, or the silicon oxide film 9 has a smaller distance than approximately 1.0 micrometers in the horizontal direction from the trench isolation region, or the silicon oxide film 5, stresses possessed by crystals of the silicon oxide material are caused at the edge portion of the selective oxide film, or the silicon oxide film 9. Concurrently, the selective oxidation of the selective oxidation film causes an additional stress possessed by the crystal of silicon oxide in the selective oxide film, or the silicon oxide film 9 but at the overlapping region with and in the vicinity in the silicon oxide film 5 within the trench groove.

With respect to the oxidation mechanism of the selective oxidation film, the silicon oxide film 5 within the trench groove essentially includes silicon which has been oxidized, and thus no silicon material to be oxidized by the selective oxidation, although the polycrystalline silicon film 7 overlaying the silicon oxide film 5 includes silicon which will be oxidized by the selective oxidation. Then, the existence of the silicon oxide film 5 renders the growth of the selective oxidation film, or the silicon oxide film 9 difficult. In contrast to the above, both the polycrystalline silicon material 6 and the n⁻-type epitaxial layer 3 are possessive of a sufficient deal of the silicon material to be oxidized by the selective oxidation, followed by being made into the silicon oxide film 9. Thus, the silicon oxide film 9 but at the overlapping region with and in the vicinity of the silicon oxide film 5 is grown at a lower growth rate than the growth rates of the other portions, for example, the polycrystalline silicon material and the n⁻-type epitaxial layer 3, Such difference of the growth rates generates stresses possessed by the crystal of the silicon oxide mainly in the vertical direction but especially at the overlapping region with and in the vicinity of the silicon oxide film 5. The cooperation of the both stresses of the silicon oxide film at its edge portions and in the vicinity of the silicon oxide film 5 generates a great deal of dislocations in the crystal of the silicon oxide. It is considerable that such dislocation caused in the selective oxide film, or the silicon oxide film 9 are likely to cause many crystal defects. The selective oxidation film, or the silicon oxide film 9 which is possessive of a great deal of the crystal defects will no longer serve as the isolation region. The results of those forces the yield of the products to substantially be lowered.

Another disadvantage with the isolation region is that the selective oxidation film, or the silicon oxide film 9 has depression regions, and thus has an irregularity in its surface. Descriptions with respect to the oxidation mechanism of the selective oxidation film, especially in the vicinity of the silicon oxide film 5, will subsequently be made to appear. The silicon oxide film 5 within the trench groove essentially includes silicon which has been oxidized, and thus no silicon material to be oxidized by the selective oxidation, although the polycrystalline silicon film 7 overlaying the silicon oxide film 5 includes silicon which will be oxidized by the selective oxidation. Then, at the oxidation process, the presence of the silicon oxide film 5 serves to prevent the growth of the selective oxidation film, or the silicon oxide film 9. In contrast to the above, both the polycrystalline silicon material 6 and the n⁻-type epitaxial layer 3 are possessive of a sufficient deal of the silicon material to be oxidized by the selective oxidation, followed by being made into the silicon oxide film 9. Thus, the silicon oxide film 9 but at the overlapping region with and in the vicinity of the silicon oxide film 5 is grown at a lower growth rate than the growth rates of the other portions, for example, the polycrystalline silicon material 6 and the n⁻-type epitaxial layer 3. Such differences in the growth rates causes a formation of depression portions 11 in a surface of the resultant selective oxidation film, or the silicon oxide film 9. The depression portions 11 exist directly over the silicon oxide film 5 within the trench groove due to the difference in the growth rates between the vicinity portions of the silicon oxide film 5 and the opposite portion. The existence of the depression portions 11 in the surface of the selective oxidation film, or the silicon oxide film 9 causes following disadvantages. For example, there is a case that the resultant selective oxidation film, or the silicon oxide film 9 is covered by a deposition of a polycrystalline silicon film in after fabrication processes of the semiconductor integrated circuit device. The deposited polycrystalline silicon film is subsequently removed but over the resultant selective oxidation film, or the silicon oxide film 9. In this case, although the polycrystalline silicon film over the selective oxidation film is to be completely removed, a part of the polycrystalline silicon film is likely to remain at the depression portion 11 in the surface of the selective oxidation film . Such polycrystalline silicon film remaining at the depression portions 11 cause electrical short circuits. Further, such depression portions 11 is likely to accumulate dusts.

From the set forth descriptions, the disadvantages provided by the crystal defects and the depression portions 11 with such isolation region are caused by that the selective oxidation film, or the silicon oxide film 9 but at the overlapping region with and in the vicinity of the silicon oxide film 5 is lack of silicon materials which will be oxidized by the selective oxidation to be made into a part of the silicon oxide film 9. For the oxidation process, the silicon oxide film 9 but at the overlapping region with and in the vicinity of the silicon oxide film 5 has a lower growth rate than the growth rates of the polycrystalline silicon material 6 and the n⁻-type epitaxial layer 3, both of which have a sufficient deal of silicon materials which will be oxidized, followed by being made into the silicon oxide film 9. Such difference in the growth rates is caused by the existence of the silicon oxide film 5 within a region which will be made into the silicon oxide film 9. Thus, that the silicon oxide film 5 exists within a region which will be made into the silicon oxide film 9 causes the above disadvantages.

To combat this advantages with the method of forming the isolation region comprising the combination of the selective oxidation film and the trench isolation region, it is required to develop a novel method which is permissive of preventing any stress of the silicon oxide crystal involved in the selective oxidation film to be caused by the selective oxidation but at the overlapping region with and in the vicinity of the silicon oxide film 5 within the trench groove. Further, it is required to develop a novel method which is permissive of preventing any depression portion to be formed in the surface of the resultant selective oxidation film and thus the surface of the resultant selective oxidation film to have irregularity.

SUMMARY OF THE INVENTION

Accordingly it is a primary object of the present invention to provide a novel method of forming an isolation region comprising a combination of a selective isolation film and a trench isolation region involved in a semiconductor integrated circuit device.

It is a further object of the present invention to provide a novel method of forming an isolation region without crystal defect, which comprises a combination of a selective oxidation film and a trench isolation region.

It is a still further object of the present invention to provide a novel method of forming an isolation region, which is permissive of preventing stresses to be caused in the isolation region by a selective oxidation for forming a selective oxidation film.

It is yet a further object of the present invention to provide a novel method of forming an isolation region, which is permissive of preventing depression portions to Be formed in a surface of a selective oxidation film.

The above and other objects, features and advantages of the present invention will be apparent from following descriptions.

The present invention provides a novel method of forming an isolation region which comprises a combination of both a selective oxidation film and a trench isolation region involved in a semiconductor integrated circuit device. The novel method provided by the present invention essentially comprises following steps.

A trench groove is formed in a semiconductor bulk. A silicon oxide film is deposited on a surface of the trench groove. A polycrystalline silicon material is deposited within the trench groove which is cover by the silicon oxide film. The silicon oxide film is subjected to etching up to a predetermined depth so as to form a hollow portion. A polycrystalline silicon film is deposited within the hollow portion and on both surfaces of the polycrystalline silicon material and the semiconductor bulk. After that, a predetermined portion which includes the polycrystalline silicon film within the hollow portion, the polycrystalline silicon material within the trench groove and the semiconductor bulk in the vicinity of the trench groove is subjected to selective oxidation so as to form a selective oxidation film region.

Further, it is permissive that a silicon nitride film is is deposited on the silicon oxide film covering the surface of the trench groove prior to the deposition of the polycrystalline silicon material.

In addition to the above, the depth of the hollow portion within the trench groove is so determined that a border of the silicon oxide film and the polycrystalline silicon film exists at the same level as a bottom of the selective oxidation film region. It is available that the depth of the hollow portion within the trench groove is determined as to be a half of a thickness of the selective oxidation film region. It is further permissive that a silicon oxide film is formed on both surfaces of the polycrystalline silicon material and the semiconductor bulk prior to the deposition of the polycrystalline silicon film.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

The present invention provides a novel method of forming an isolation region which comprises a combination of both a selective oxidation film and a trench isolation region involved in a semiconductor integrated circuit device. A first embodiment of the present invention will now be described with reference to FIGS. 2A to 2F. In the first embodiment, the isolation region will be formed in a bipolar transistor circuit region involved in the semiconductor integrated circuit device.

Figure 1A:
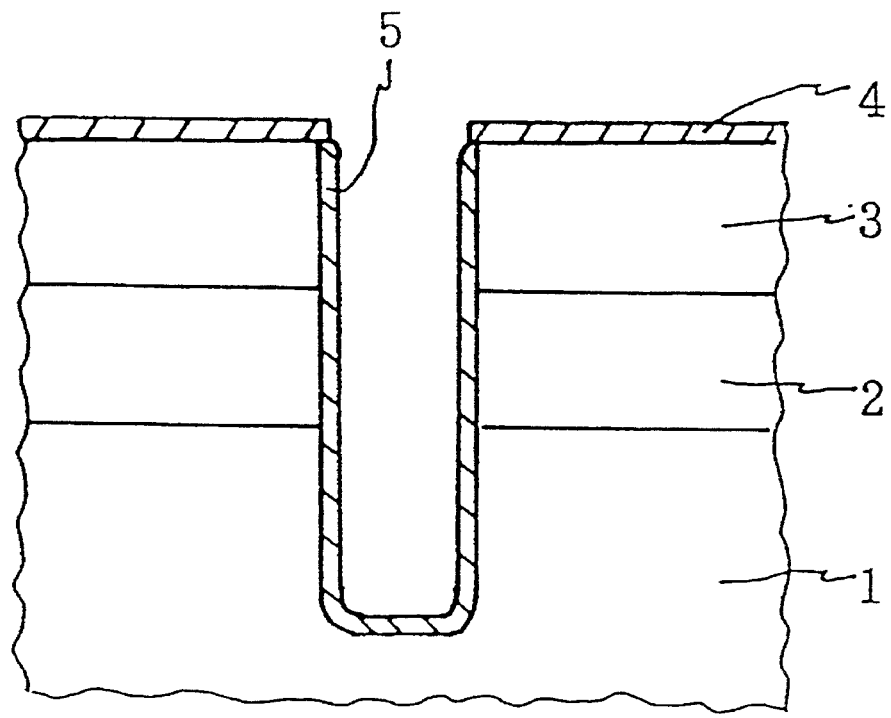
FIGS. 1A to 1E are fragmentary cross sectional elevation views illustrative of sequential steps involved in the conventional method of forming an .isolation region comprising a combination of both a selective oxidation film and a trench isolation region.
Figure 1B:
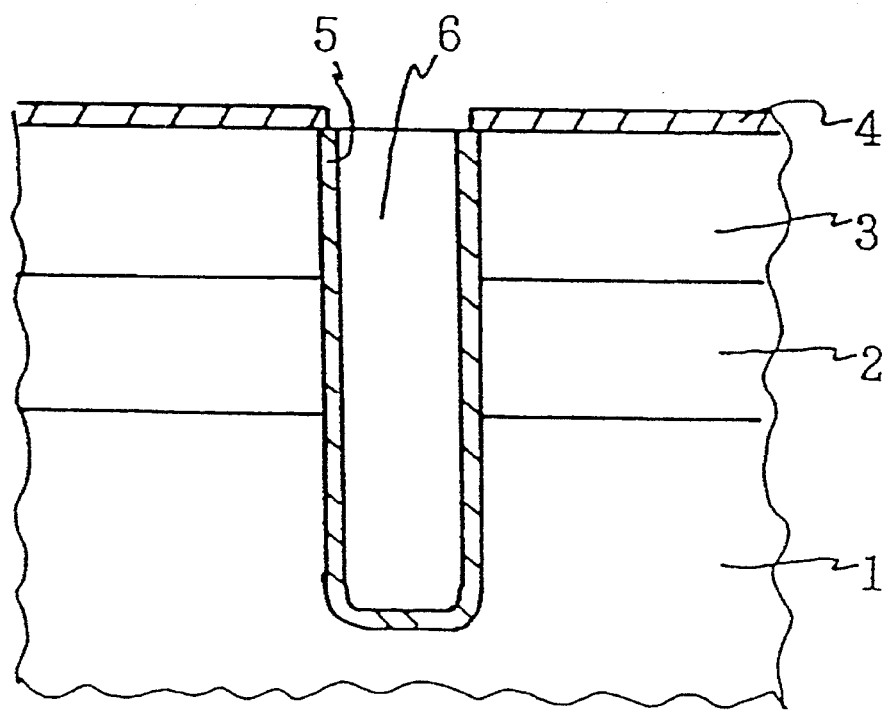
Figure 1C:
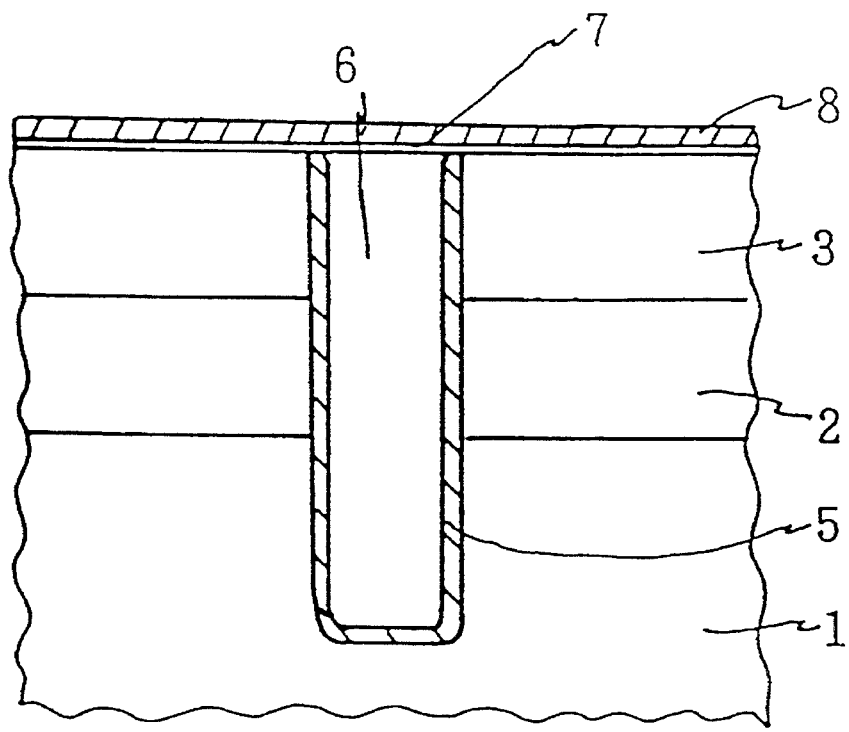
Figure 1D:
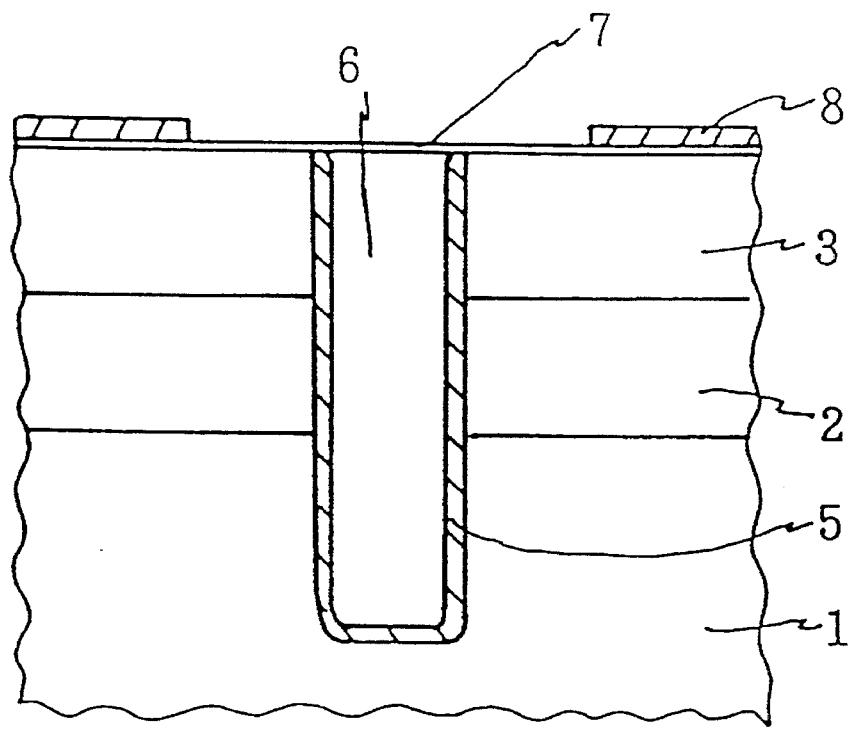
Figure 1E:
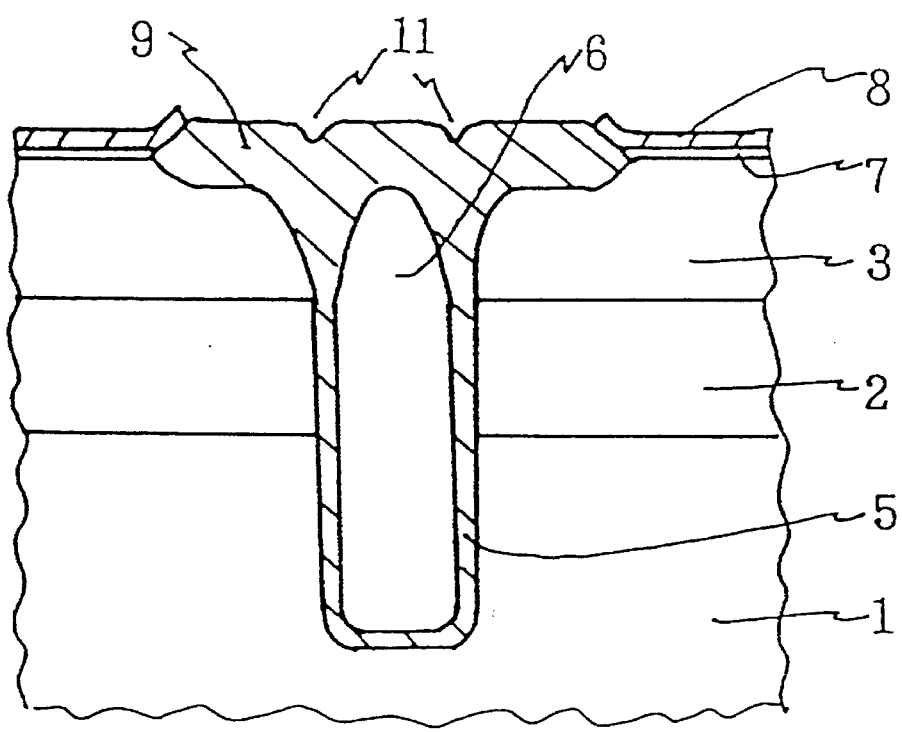
Figure 2A:
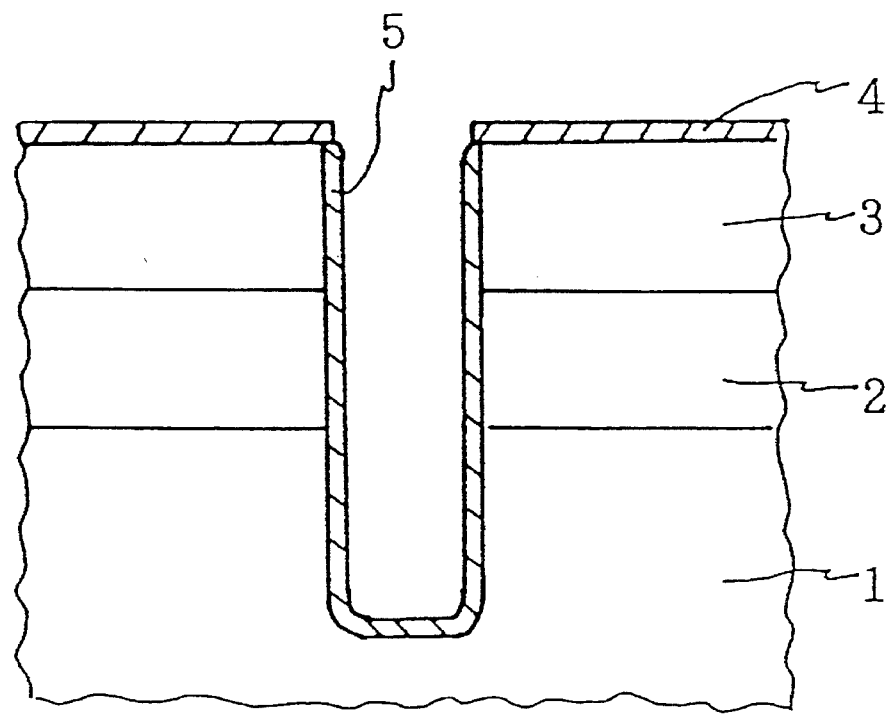
FIGS. 2A to 2F are fragmentary cross sectional elevation views illustrative of sequential steps involved in a novel method of forming an isolation region comprising a combination of both a selective oxidation film and a trench isolation region in a first embodiment of the present invention.

With reference to FIG. 2A, the bipolar transistor circuit region of the semiconductor device has a p-type silicon substrate 1. An $n^+$-type silicon buried layer 2 is formed on the p-type silicon substrate 1. An $n^-$-type epitaxial layer 3 is so formed as to overly the $n^+$-type silicon buried layer 2. A silicon nitride film 4 having a predetermined thickness is so deposited as to cover an entire surface of the $n^-$-type epitaxial layer 3. The silicon nitride film 4 is subjected to patterning so as to form an opening having a predetermined size. An etching process is accomplished by using the patterned silicon nitride film 4 as a mask so that the $n^-$-type epitaxial layer 3 and the $n^+$-type silicon buried layer 2 are removed but only directly under the opening region of the silicon nitride film 4. Further, the p-type silicon substrate 1 is removed up to a predetermined depth, typically 4 to 5 micrometers but only directly under the opening region of the silicon nitride film 4. As a result of those, a trench groove having predetermined sizes in the length, the width and the depth of 4 to 5 micrometers is formed through the three layers comprising the p-type silicon substrate 1, the $n^+$-type silicon buried layer and the $n^-$-type epitaxial layer 3. After that, a silicon oxide film 5 having a thickness in the range from 1000 to 1500 angstroms is so formed as to cover an entire surface of an inner wall of the trench groove.

Figure 2B:
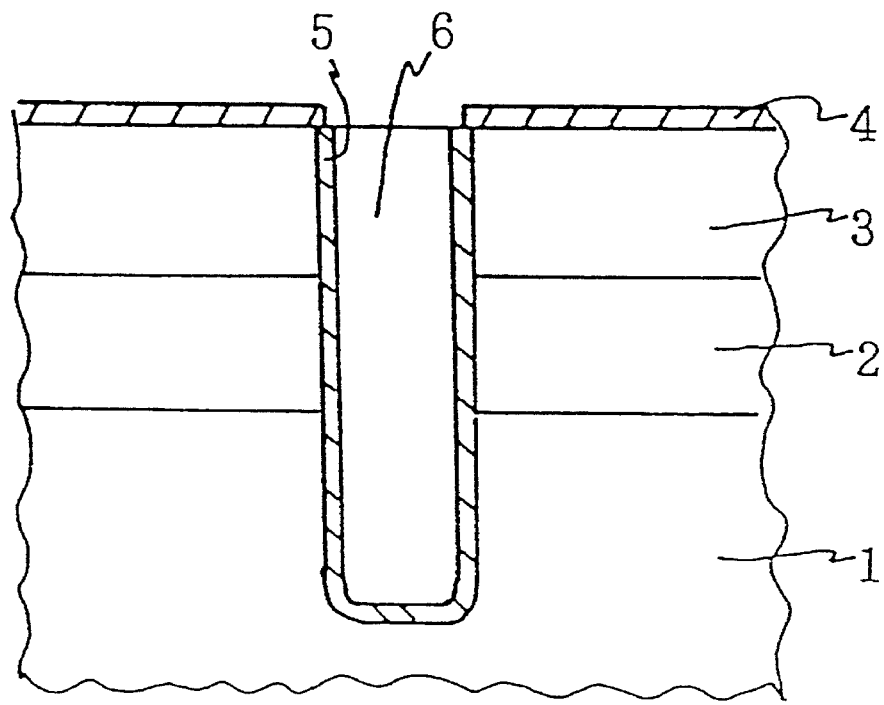

With reference to FIG. 2B, a polycrystalline silicon material 6 is deposited up to a predetermined thickness of 10000 to 20000 angstroms on the silicon oxide film 5 covering the inner wall surface of the trench groove so that the trench-groove is completely filled with the polycrystalline silicon material 6. Further, the polycrystalline silicon material 6 except within the trench groove is unnecessary for the device. Thus, an etch back process is carried out for a removal of the deposited polycrystalline silicon material 6 except within the trench groove. By such etch back process, the polycrystalline silicon material 6 is so removed as to have the polycrystalline silicon material 6 remain within the trench groove only.

Figure 2C:
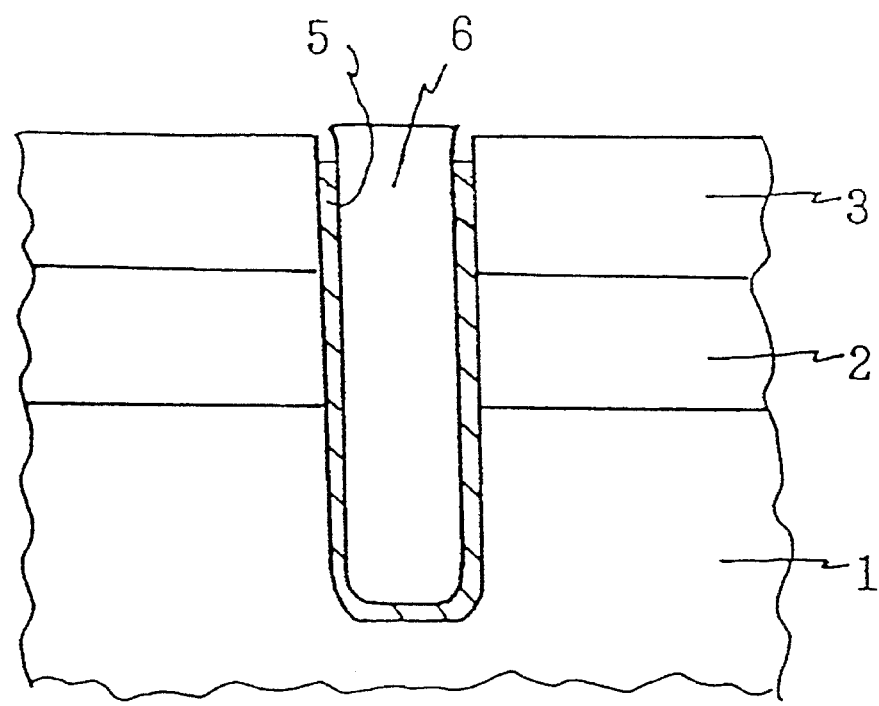

With reference to FIG. 2C, a removal of the silicon nitride film 4 which has been finished serving as the mask for the etching process follows the removal of the unnecessary portions of the polycrystalline silicon material 6. The result of the removals of both the silicon nitride film 4 and the unnecessary portions of the polycrystalline silicon material 6 is that an upper surface of the n⁻-type epitaxial layer 3 is exposed. Although the above recited processes are analogous to the prior art, one of the improvements in the novel method of this embodiment over the prior art will be manifested in following steps.

Subsequently, the silicon oxide film 5 formed on the inner wall of the trench groove is removed from the surface of device up to a predetermined depth, typically 2000 to 4000 angstroms so as to have both the polycrystalline silicon material 6 and the n⁻-type epitaxial layer 3 remain. The result of such removal of a part of the silicon oxide film 5 is that hollow portions are formed directly over the remaining silicon oxide film 5. Then, the hollow portions are defined by the vertical walls of the polycrystalline silicon material 6 and the n⁻-type epitaxial layer 3 as well as an upper surface of the remaining silicon oxide film 5. The depth of the removal of the silicon oxide film 5 is so determined that the remaining silicon oxide film 5 exists under a region which will be formed into a selective oxidation film region by a selective oxidation. It is required that a border of the hollow portions and the remaining silicon oxide film 5 exists in the vicinity of a bottom surface of the selective oxidation film which will be formed in after steps. Preferably, the border of the remaining silicon oxide film 5 exists at the same level as the bottom surface of the selective oxidation film which will be formed in after steps. It is permissive that the depth of the removal of the silicon oxide film 5 is so determined as to be made into a half of a predetermined thickness of a selective oxidation film which will be formed in after steps. As a result of those, a selective oxidation film will in after steps be formed a region without the silicon oxide film 5.

Figure 2D:
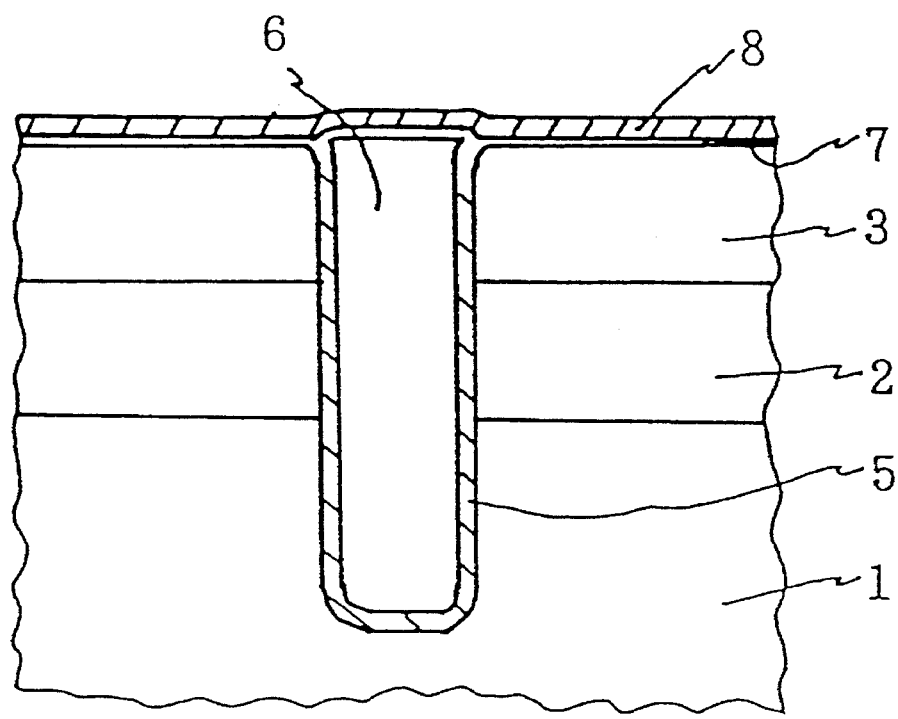

With reference to FIG. 2D, the n⁻-type epitaxial layer 3 is oxidized but only a surface region thereof having a depth in the range from 300 to 500 angstroms thereby resulting in a formation of a silicon oxide film having a thickness in the range from 300 to 500 angstroms, while an illustration thereof is omitted. In addition to the above, a polycrystalline silicon film 7 is deposited up to a thickness in the range from 500 to 1000 angstroms so as to cover the exposed upper surfaces of the n⁻-type epitaxial layer 3 through the silicon oxide film which is not illustrated. The upper surface of the polycrystalline silicon material 6 within the trench groove is also covered with the polycrystalline silicon film 7 through the silicon oxide film which is not illustrated. Concurrently, the hollow portions are completely filled with the polycrystalline silicon film 7, by which the polycrystalline silicon film 7 which has been deposited within the hollow portions will in after steps be made into a part of a selective oxidation film. Preferably, the border of the polycrystalline silicon film 7 and the remaining silicon oxide film 5 exists at the same level as the bottom surface of the selective oxidation film which will be formed in after steps. After that, a silicon nitride film 8 is deposited on the polycrystalline silicon film 7 up to a thickness in the range from 2000 to 3000 angstroms so as to overlay an entire surface of the polycrystalline silicon film 7.

Figure 2E:
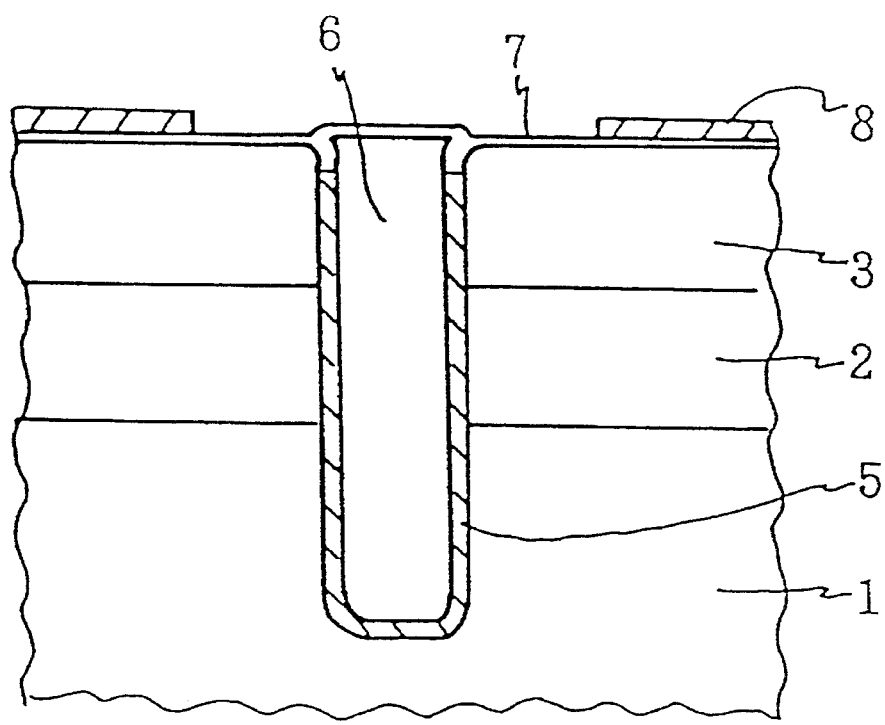

With reference to FIG. 2E, the silicon nitride film 8 is subjected to etching so that a silicon nitride film 8 is removed but only a predetermined area thereof overlying the trench groove and its vicinity portions. The result of the patterning by etching is that the silicon oxide film 8 is formed with an opening area, whose peripheral edge fences the trench groove and the n⁻-type epitaxial layer 3 in the vicinity portions of trench groove.

Figure 2F:
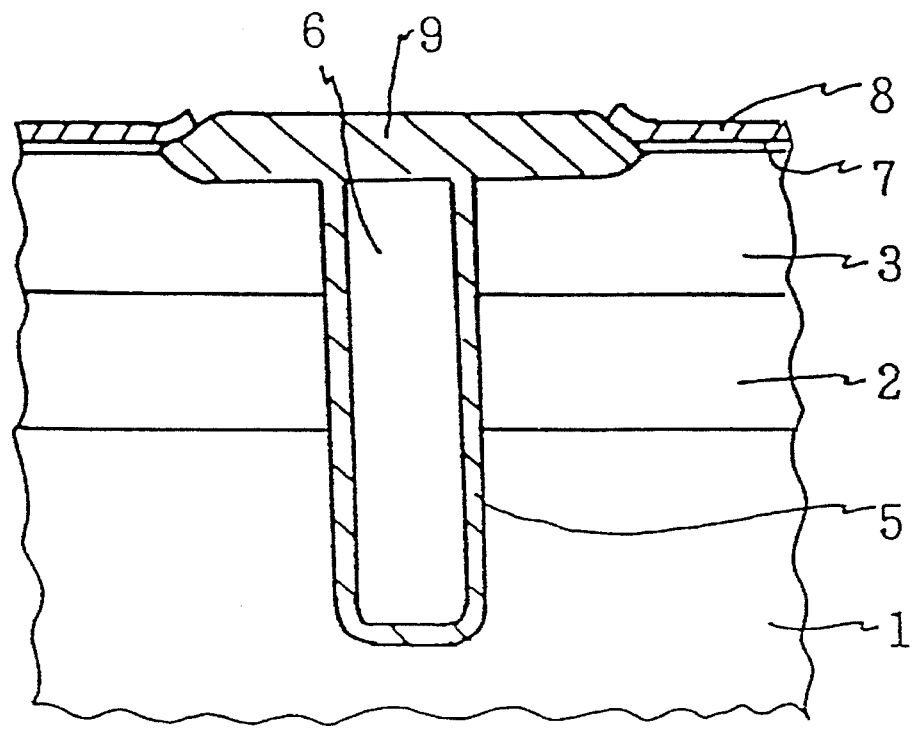

With reference to FIG. 2F, a selective oxidization is implemented by using the patterned silicon nitride film 8 as a mask. The result of the selective oxidization is that the trench groove and its vicinity portions in the n⁻-type epitaxial layer 3 underlying the opening area of the silicon nitride film 8 are oxidized up to a depth in the range from 4000 to 8000 angstroms. Thus, a thick silicon oxide film 9 is formed in the surface area of the device except for the covered area by the patterned silicon nitride film 8 thereby completing a formation of the isolation region comprising the combination of the trench isolation region with the selective oxidation film.

Advantages provided by the first embodiment of the present invention in the isolation region comprising the combination of the trench isolation region with the selective oxidation isolation region will subsequently be described.

One of advantages provided by the first embodiment of the present invention is that the resultant isolation region is free from crystal defects generated in the silicon oxide film 9 by the selective oxidation. When an edge portion of the selective oxide film, or the silicon oxide film 9 has a smaller distance than approximately 1.0 micrometers in the horizontal direction from the trench isolation region, or the silicon oxide film 5, the novel method is permisive of suppressing stresses possessed by crystals of the silicon oxide material to be caused at the edge portion of the selective oxide film, or the silicon oxide film 9. Concurrently, the novel method provided by the first embodiment of the present invention is free from that the selective oxidation for forming the silicon oxide film 9 causes an additional stress possessed by the crystal of silicon oxide in the selective oxide film, or the silicon oxide film 9 but directly over and in the vicinity in the silicon oxide film 5 within the trench groove.

Descriptions with respect to the oxidation mechanism of the selective oxidation film especially directly over and in the vicinity of the silicon oxide film 5 will be made to clear advantages provided by the first embodiment of the present invention. The polycrystalline silicon film 7 within the hollow portions essentially includes a sufficient deal of silicon materials to be oxidized by the selective oxidation, followed by being made into the silicon oxide film 9. In contrast to the above, the silicon oxide film 5 underlaying the polycrystalline silicon film 7 includes silicon which has been oxidized. Then, the existence of the polycrystalline silicon film 7 deposited within the hollow portion is able to promote the growth of the selective oxidation film, or the silicon oxide film 9. Both the polycrystalline silicon material 6 and the n⁻-type epitaxial layer 3 are also possessive of a sufficient deal of the silicon material to be oxidized by the selective oxidation, followed by being made into the silicon oxide film 9. Thus, the silicon oxide film 9 but directly over and in the vicinity of the silicon oxide film 5 is grown at a growth rate equal or approximate to the other portions, for example, the polycrystalline silicon material 6 and the n⁻-type epitaxial layer 3. There is no difference in the growth rates on the selective oxidation process. Thus, the novel method provided by the first embodiment of the present invention allows preventing a generation of stresses mainly in the vertical direction possessed by the crystal of the silicon oxide film 9 but especially directly over and in the vicinity of the silicon oxide film 5. Such resultant isolation region formed by the novel method provided by the first embodiment of the present invention is, therefore, free from that the cooperation of the both stresses of the silicon oxide film 9 at its edge portions and directly over and in the vicinity of the silicon oxide film 5 generates a great deal of dislocations in the crystal of the silicon oxide. Then, such resultant isolation region formed by the novel method provided by the first embodiment of the present invention is also free from disadvantages of that the dislocation caused in the selective oxide film, or the silicon oxide film 9 are likely to cause many crystal defects. The selective oxidation film, or the silicon oxide film 9 formed by the first embodiment of the present invention is possessive of no crystal defect. Such silicon oxide film 9 without crystal defect will be able to serve as the isolation region. The novel method provided by the first embodiment of the present invention is permissive of the resultant silicon oxide film 9 without crystal defect to have a great ability as the isolation region as well as a long life time. The results of those also enables the yield of the products to remain at a high value.

Another of advantages with the isolation region is that the selective oxidation film, or the silicon oxide film 9 has no depression portion, and thus has uniformity in its surface. Descriptions with respect to the oxidation mechanism of the selective oxidation film, especially in the vicinity of the silicon oxide film 5 will subsequently be made to appear a mechanism in the formation of such depression portions, although it concludes recitations overlapping the above recitations. The polycrystalline silicon film 7 filling the hollow portions within the trench groove includes a sufficient deal of silicon which will be oxidized by the selective oxidation, followed by being made into the silicon oxide film 9. In contrast to the above, the silicon oxide film 5 underlying the polycrystalline silicon film 7 essentially includes silicon which has been oxidized, and thus no silicon material to be oxidized by the selective oxidation. Then, at the oxidation process, the presence of the polycrystalline silicon film 7 filling the hollow portions overlying the silicon oxide film 5 serves to promote the growth of the selective oxidation film, or the silicon oxide film 9. Both the polycrystalline silicon material 6 and the n⁻-type epitaxial layer 3 are also possessive of a sufficient deal of the silicon material to be oxidized by the selective oxidation, followed by being made into the silicon oxide film 9. Thus, the silicon oxide film 9 but directly over and in the vicinity of the silicon oxide film 5 is grown at a growth rate equal or approximate to the growth rates of the other portions, for example, the polycrystalline silicon material 6 and the n⁻-type epitaxial layer 3. There is no difference in the growth rates on the selective oxidation process. The resultant selective oxidation film, or the silicon oxide film 9 formed by the novel method provided by the first embodiment of the present invention is free from a formation of depression portion in its surface directly over the silicon oxide film 5 within the trench groove due to no difference in the growth rates. The isolation region formed by the novel method provided by the first embodiment of the present invention is, therefore, free of that the existence of the depression portions in the surface of the selective oxidation film, or the silicon oxide film 9 causes the various disadvantages which have been recited in the recitations of the disadvantages possessed by the prior art.

From the above recitations, the resultant isolation region formed by the first embodiment of the present invention has no crystal defect and no depression portion. The novel method provided by the first embodiment of the present invention is permissive of preventing any stress of the silicon oxide crystal involved in the selective oxidation film to be caused by the selective oxidation but especially directly over and in the vicinity of the silicon oxide film 5 within the trench groove. The novel method provided by the first embodiment of the present invention is further permissive of preventing any depression portion to be formed in the surface of the resultant selective oxidation film and thus the surface of the resultant selective oxidation film to have irregularity.

A second embodiment of the present invention will now be described with reference to FIGS. 3A to 3E. In the second embodiment, the isolation region will also be formed in a bipolar transistor circuit region involved in the semiconductor integrated circuit device.

Figure 3A:
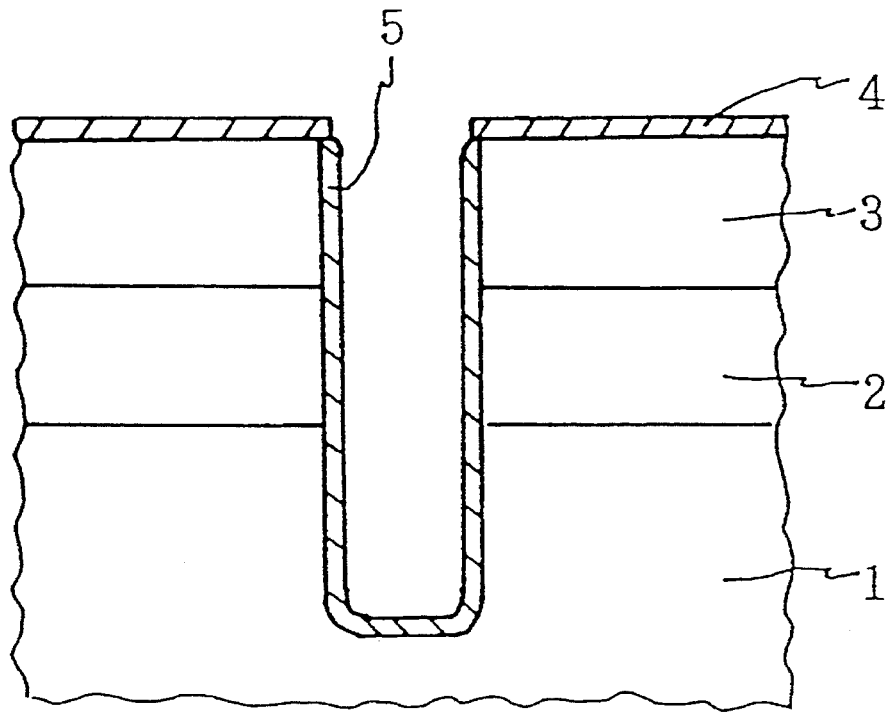
FIGS. 3A to 3D are fragmentary cross sectional elevation views illustrative of sequential steps involved in a novel method of forming an isolation region comprising a combination of both a selective oxidation film and a trench isolation region in a second embodiment of the present invention.

With reference to FIG. 3A, the bipolar transistor circuit region of the semiconductor device has a p-type silicon substrate 1. An n⁺-type silicon buried layer 2 is formed on the p-type silicon substrate 1. An n⁻-type epitaxial layer 3 is so formed as to overly the n -type silicon buried layer 2. A silicon nitride film 4 having a predetermined thickness is so deposited as to cover an entire surface of the n⁻-type epitaxial layer 3. The silicon nitride film 4 is subjected to patterning so as to form an opening having a predetermined size. An etching process is accomplished by using the patterned silicon nitride film 4 as a mask so that the n⁻-type epitaxial layer 3 and the n⁺-type silicon buried layer 2 are removed but only directly under the opening region of the silicon nitride film 4. Further, the p-type silicon substrate 1 is removed up to a predetermined depth, typically 4 to 5 micrometers but only directly under the opening region of the silicon nitride film 4. As a result of those, a trench groove having predetermined sizes in the length, the width and the depth of 4 to 5 micrometers is formed through the three layers comprising the p-type silicon substrate 1, the n⁺-type silicon buried layer and the n⁻-type epitaxial layer 3. After that, a silicon oxide film 5 having a thickness in the range from 1000 to 1500 angstroms is so formed as to cover an entire surface of an inner wall of the trench groove. The above steps are analogues to that of the first embodiment. The difference of the method of forming the isolation region in the second embodiment from the first embodiment are appeared following steps.

Figure 3B:
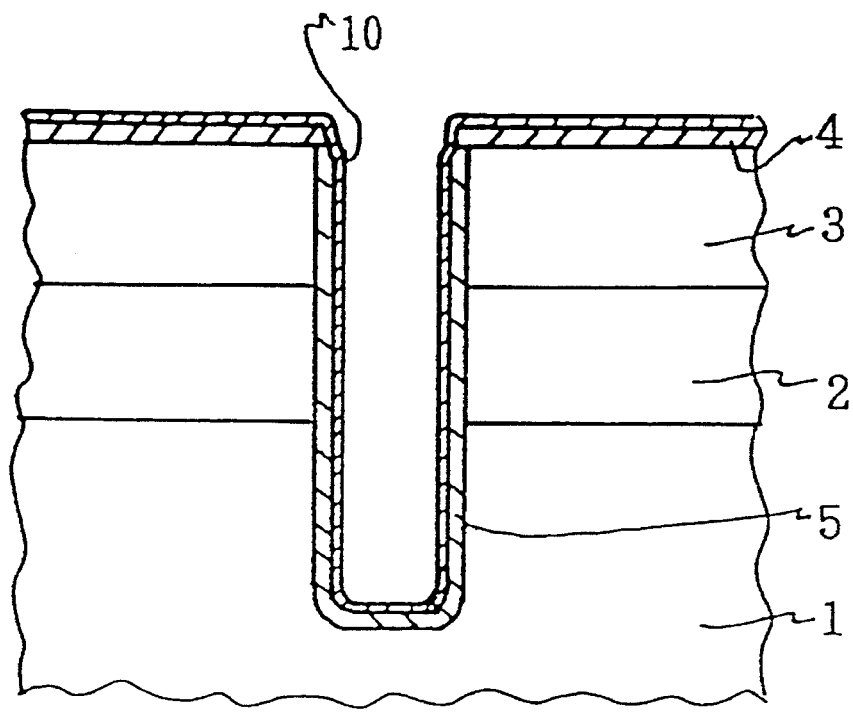
Figure 3C:
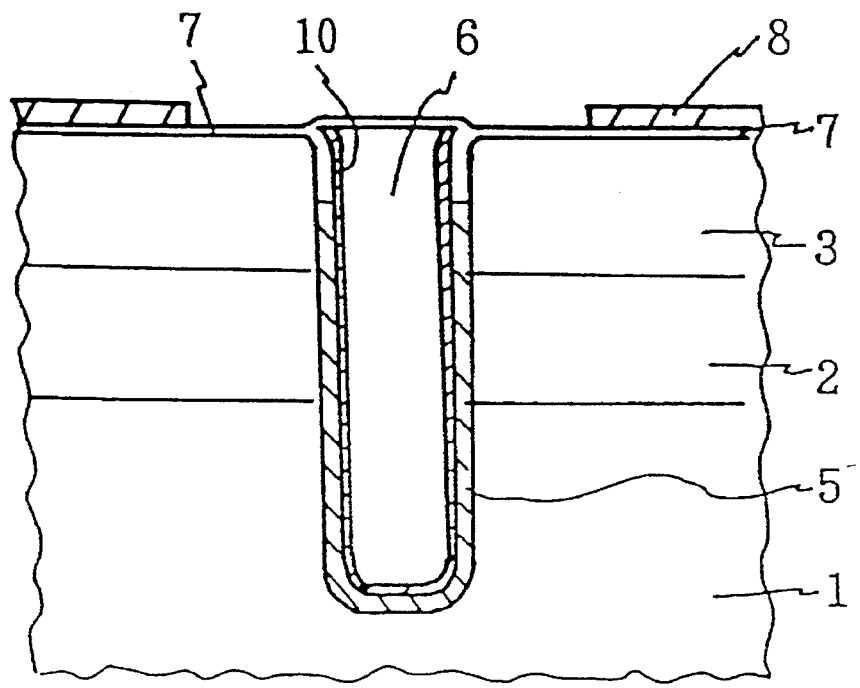

With reference to FIG. 3B, subsequently a silicon nitride film 10 is deposited on an entire surface of the device up to a predetermined thickness, typically in the range from 500 to 1000 angstroms so as to cover not only the silicon nitride film 4 but the silicon oxide film 5 within the trench groove. After that, a polycrystalline silicon material 6 is deposited up to a predetermined thickness on the silicon nitride film 10 covering the silicon oxide film 5 on the inner wall surface of the trench groove so that the trench groove is completely filled with the polycrystalline silicon material 6. Further, the polycrystalline silicon material 6 except within the trench groove is unnecessary for the device. Thus, an etch back process is carried out for a removal of the deposited polycrystalline silicon material 6 except within the trench groove. By such etch back process, the polycrystalline silicon material 6 is so removed as to have the polycrystalline silicon material 6 remain within the trench groove only.

After the removal of the unnecessary portions of the polycrystalline silicon material 6, the deposited silicon nitride film 10 is partially removed but only on the silicon nitride film 4 deposited on the n⁻-type epitaxial layer 3. The result of the removal is that the silicon nitride film 10 remains within the trench groove only. In addition, a removal of the silicon nitride film 4 which has been finished serving as the mask for the etching process follows the removal of the silicon nitride film 10. The result of the removals of both the silicon nitride films 4 and 10 as well as the unnecessary portions of the polycrystalline silicon material 6 is that an upper surface of the n⁻-type epitaxial layer 3 is exposed.

Subsequently, the silicon oxide film 5 formed on the inner wall of the trench groove is removed from the surface of device up to a predetermined depth, typically 2000 to 4000 angstroms but so as to have the silicon nitride film 10 remain, in addition both the polycrystalline silicon material 6 and the n⁻-type epitaxial layer 3 remain. The silicon nitride film 10 fences and thus electrically separates the polycrystalline silicon material 6 within the trench groove from the n⁻-type epitaxial layer 3, even if the silicon oxide film 5 within the trench groove has any missing parts. The result of such removal of a part of the silicon oxide film 5 is that hollow portions are formed directly over the remaining silicon oxide film 5. Then, the hollow portions are defined by the vertical walls of the silicon nitride film 10 and the n⁻-type epitaxial layer 3 as well as an upper surface of the remaining silicon oxide film 5. The depth of the removal of the silicon oxide film 5 is so determined that the remaining silicon oxide film 5 exists under a region which will be formed into a selective oxidation film region by a selective oxidation. It is required that a border of the hollow portions and the remaining silicon oxide film 5 exists in the vicinity of a bottom surface of the selective oxidation film which will be formed in after steps. Preferably, the border of the remaining silicon oxide film 5 exists at the same level as the bottom surface of the selective oxidation film which will be formed in after steps. It is permissive that the depth of the removal of the silicon oxide film 5 is so determined as to be made into a half of a predetermined thickness of a selective oxidation film which will be formed in after steps. As a result of those, a selective oxidation film will in after steps be formed a region without the silicon oxide film 5.

Further, the n⁻-type epitaxial layer 3 is oxidized but only a surface region thereof having a depth in the range from 300 to 500 angstroms thereby resulting in a formation of a silicon oxide film having a thickness in the range from 300 to 500 angstroms, while an illustration thereof is omitted. In addition to the above, a polycrystalline silicon film 7 is deposited up to a thickness in the range from 500 to 1000 angstroms so as to cover the exposed upper surfaces of the n⁻-type epitaxial layer 3 through the silicon oxide film which is not illustrated. The upper surface of the polycrystalline silicon material 6 within the trench groove is also covered with the polycrystalline silicon film 7 through the silicon oxide film which is not illustrated. Concurrently, the hollow portions are completely filled with the polycrystalline silicon film 7, by which the polycrystalline silicon film 7 which has been deposited within the hollow portions will in after steps be made into a part of a selective oxidation film. Preferably, the border of the polycrystalline silicon film 7 and the remaining silicon oxide film 5 exists at the same level as the bottom surface of the selective oxidation film which will be formed in after steps.

After that, a silicon nitride film 8 is deposited on the polycrystalline silicon film 7 up to a thickness in the range from 2000 to 3000 angstroms so as to overlay an entire surface of the polycrystalline silicon film 7. The silicon nitride film 8 is subjected to etching so that a silicon nitride film 8 is removed but only a predetermined area thereof overlying the trench groove and its vicinity portions. The result of the patterning by etching is that the silicon oxide film 8 is formed with an opening area, whose peripheral edge fences the trench groove and the n⁻-type epitaxial layer 3 in the vicinity portions of trench groove.

Figure 3D:
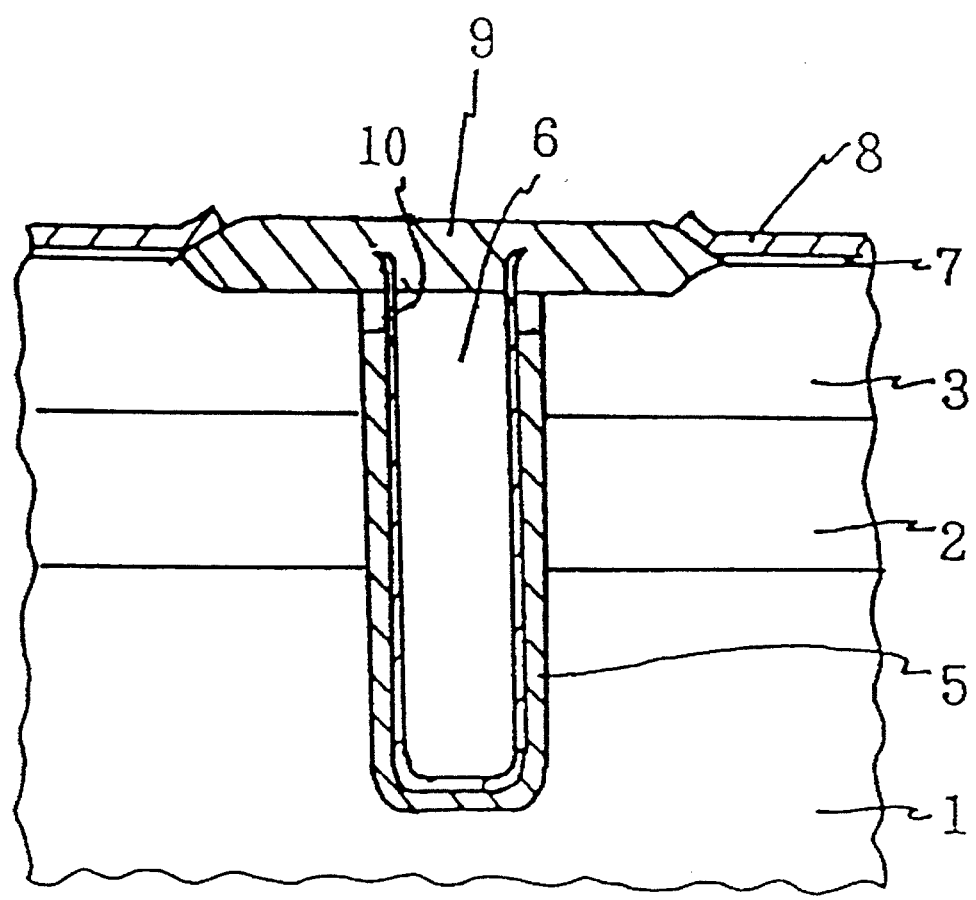

With reference to FIG. 3D, a selective oxidization is implemented by using the patterned silicon nitride film 8 as a mask. The result of the selective oxidization is that the trench groove and its vicinity portions in the n⁻-type epitaxial layer 3 underlying the opening area of the silicon nitride film 8 are oxidized up to a depth in the range from 4000 to 8000 angstroms. Thus, a thick silicon oxide film 9 is formed in the surface area of the device except for the covered area by the patterned silicon nitride film 8 thereby completing a formation of the isolation region comprising the combination of the trench isolation region with the selective oxidation film.

Advantages provided by the second embodiment of the present invention in the isolation region comprising the combination of the trench isolation region with the selective oxidation isolation region will subsequently be described.

One of advantages in the novel method provided by the second embodiment of the present invention over the first embodiment is that the silicon nitride film 10 fences and thus electrically separates the polycrystalline silicon material 6 from the n⁻-type epitaxial layer 3.

The depth of the removal of the silicon oxide film 5 is so determined that the remaining silicon oxide film 5 exists under a region which will be formed into a selective oxidation film region by a selective oxidation. It is required that a border of the hollow portions and the remaining silicon oxide film 5 exists in the vicinity of a bottom surface of the selective oxidation film which will be formed in after steps. Preferably, the border of the remaining silicon oxide film 5 exists at the same level as the bottom surface of the selective oxidation film which will be formed in after steps. It is permissive that the depth of the removal of the silicon oxide film 5 is so determined as to be equal to or larger than the depth of a half of a predetermined thickness of a selective oxidation film which will be formed in after steps.

If the hollow portions has a larger depth, it is possible that all of the polycrystalline silicon film 7 existing within the hollow portions having a larger depth is not oxidized, and thus the polycrystalline silicon film 7 remains but only in the vicinity of the silicon oxide film 5. Nevertheless, such case is undesirable. In such case, the silicon nitride film 10 serves to electrically separates the polycrystalline silicon material 6 from the remaining unnecessary polycrystalline silicon film 7 within the hollow portions, and thus from the n⁻-type epitaxial layer 3. The existence of the silicon nitride film 10 is permissive of electrical isolation to be implemented, even if the polycrystalline silicon film 7 serving as the conductive material remains at the bottom of the hollow portion within the trench groove. The margin of the depth of the hollow portion within the trench groove is enlarged by that the silicon nitride film 10 fences the polycrystalline silicon material 6. Further, the yield of the products is improved by the formation of the silicon nitride film 10 within the trench groove.

Another of advantages in the novel method provided by the second embodiment of the present invention is that the resultant isolation region is free from crystal defects generated in the silicon oxide film 9 by the selective oxidation. When an edge portion of the selective oxide film, or the silicon oxide film 9 has a smaller distance than approximately 1.0 micrometers in the horizontal direction from the trench isolation region, or the silicon oxide film 5, the novel method provided by the second embodiment of the present invention is permisive of suppressing stresses possessed by crystals of the silicon oxide material to be caused at the edge portion of the selective oxide film, or the silicon oxide film 9. Concurrently, the novel method provided by the second embodiment of the present invention is free from that the selective oxidation for forming the silicon oxide film 9 causes an additional stress possessed by the crystal of silicon oxide in the selective oxide film, or the silicon oxide film 9 but directly over and in the vicinity in the silicon oxide film 5 within the trench groove.

Descriptions with respect to the oxidation mechanism of the selective oxidation film especially directly over and in the vicinity of the silicon oxide film 5 will be made to clear advantages provided by the second embodiment of the present invention. The polycrystalline silicon film 7 within the hollow portions essentially includes a sufficient deal of silicon materials to be oxidized by the selective oxidation, followed by being made into the silicon oxide film 9. In contrast to the above, the silicon oxide film 5 underlaying the polycrystalline silicon film 7 includes silicon which has been oxidized. Then, the existence of the polycrystalline silicon film 7 deposited within the hollow portion is able to promote the growth of the selective oxidation film, or the silicon oxide film 9. Both the polycrystalline silicon material 6 and the n⁻-type epitaxial Layer 3 are also possessive of a sufficient deal of the silicon material to be oxidized by the selective oxidation, followed by being made into the silicon oxide film 9. Thus, the silicon oxide film 9 but directly over and in the vicinity of the silicon oxide film 5 is grown at a growth rate equal or approximate to the other portions, for example, the polycrystalline silicon material 6 and the n⁻-type epitaxial layer 3. There is no difference in the growth rates on the selective oxidation process. Thus, the novel method provided by the second embodiment of the present invention allows preventing a generation of stresses mainly in the vertical direction possessed by the crystal of the silicon oxide film 9 but especially directly over and in the vicinity of the silicon oxide film 5. Such resultant isolation region formed by the novel method provided by the second embodiment of the present invention is, therefore, free from that the cooperation of the both stresses of the silicon oxide film 9 at its edge portions and directly over and in the vicinity of the silicon oxide film 5 generates a great deal of dislocations in the crystal of the silicon oxide. Then, such resultant isolation region formed by the novel method provided by the second embodiment of the present invention is also free from disadvantages of that the dislocation caused in the selective oxide film, or the silicon oxide film 9 are likely to cause many crystal defects. The selective oxidation film, or the silicon oxide film 9 formed by the second embodiment of the present invention is possessive of no crystal defect. Such silicon oxide film 9 without crystal defect will be able to serve as the isolation region. The novel method provided by the second embodiment of the present invention is permissive of the resultant silicon oxide film 9 without crystal defect to have a great ability as the isolation region as well as a long life time. The results of those also enables the yield of the products to remain at a high value.

A further advantage in the isolation region provided by the novel method of the second embodiment of the present invention is that the selective oxidation film, or the silicon oxide film 9 has no depression portion, and thus has uniformity in its surface. Descriptions with respect to that the silicon oxide film 9 has no depression portion will be omitted, because it is analogues to that of the first embodiment.

Needless to say, the novel method of forming the isolation region comprising the combination of the trench isolation region with the selective oxidation film, which is provided by the present invention is applicable to other semiconductor devices, although in the above embodiments the novel method is applied to the bipolar transistor integrated circuit device, typically the emitter coupled logic circuit device having a higher integration.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the sprit and scopes of the invention.

What is claimed is :

1. A method of forming a trench isolation region and a selective oxidation film region in a semiconductor bulk region, said method comprising the steps of:

forming a trench groove within a semiconductor bulk region;

depositing a silicon oxide film on an entire surface of said trench groove;

forming a silicon nitride film on said silicon oxide film covering the surface of said silicon oxide film;

depositing a first polycrystalline silicon material within said trench groove;

subjecting said silicon oxide film to etching up to a predetermined depth so as to form a hollow portion between said silicon nitride film and said semiconductor bulk region whereby said hollow portion is isolated through said silicon nitride film from said first polycrystalline silicon material within said trench groove;

filling up said hollow portion with a second polycrystalline silicon material so that said polysilicon material within the hollow portion is isolated through said silicon nitride film from said first polycrystalline silicon material within said trench groove;

depositing a polycrystalline silicon film on both surfaces of said first and second polycrystalline silicon materials and on a surface of said semiconductor bulk region as well as on a top portion of said silicon nitride film; and subjecting a predetermined portion of said polycrystalline silicon film to a selective oxidation so as to form a field oxide film wherein an upper part of said second polycrystalline silicon material within the hollow portion is oxidized thereby to serve as said field oxide film free from any crystal defects and an unoxidized lower portion of said second polycrystalline silicon material within the hollow portion remains both on a top portion of said silicon oxide film within said trench groove and beneath said field oxide film, said unoxidized lower portion of said second polycrystalline silicon material being also sandwiched in a horizontal direction between said semiconductor bulk region and said silicon nitride film which electrically isolates said first polycrystalline silicon material within said trench groove from said unoxidized lower portion of said second polycrystalline silicon material in contact with said semiconductor bulk region.

2. The method of forming an isolation region as claimed in claim 1, wherein the depth of said hollow portion is so determined that a border of said silicon oxide film and said polycrystalline silicon film exists at the same level as a bottom of said selective oxidation film region.

3. The method of forming an isolation region as claimed in claim 1, wherein the depth of said hollow portion is determined to be one half of a thickness of said selective oxidation film region.

* * * * *